United States Patent
Liu et al.

(10) Patent No.: US 9,576,827 B2
(45) Date of Patent: Feb. 21, 2017

(54) APPARATUS AND METHOD FOR WAFER LEVEL BONDING

(71) Applicant: Taiwan Semiconductor Manufacturing Company, Ltd., Hsin-Chu (TW)

(72) Inventors: Ping-Yin Liu, Yonghe (TW); Yen-Chang Chu, Tainan (TW); Xin-Hua Huang, Xihu Township (TW); Lan-Lin Chao, Sindian (TW); Yeur-Luen Tu, Taichung (TW); Ru-Liang Lee, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/298,692

(22) Filed: Jun. 6, 2014

(65) Prior Publication Data

US 2015/0357226 A1 Dec. 10, 2015

(51) Int. Cl.
*H01L 23/00* (2006.01)
*H01L 21/67* (2006.01)
*H01L 25/00* (2006.01)
*B23B 31/30* (2006.01)

(52) U.S. Cl.
CPC ....... *H01L 21/67092* (2013.01); *B23B 31/305* (2013.01); *B23B 31/307* (2013.01); *H01L 24/75* (2013.01); *H01L 24/94* (2013.01); *H01L 25/50* (2013.01); *H01L 2224/94* (2013.01); *H01L 2225/06593* (2013.01); *H01L 2924/1431* (2013.01); *H01L 2924/1433* (2013.01); *H01L 2924/1434* (2013.01); *H01L 2924/3511* (2013.01); *Y10T 156/14* (2015.01)

(58) Field of Classification Search
None
See application file for complete search history.

(56) References Cited

U.S. PATENT DOCUMENTS

| | | | |
|---|---|---|---|
| 4,298,273 A | 11/1981 | Nishizuka et al. | |
| 5,129,827 A | 7/1992 | Hoshi et al. | |
| 5,273,553 A * | 12/1993 | Hoshi | H01L 21/67092 148/DIG. 6 |
| 5,500,540 A | 3/1996 | Jewell et al. | |
| 6,892,769 B2 | 5/2005 | Hong | |

(Continued)

FOREIGN PATENT DOCUMENTS

| | | |
|---|---|---|
| JP | 794675 | 4/1995 |
| JP | 2013258377 | 12/2013 |

(Continued)

*Primary Examiner* — Evren Seven
*Assistant Examiner* — Steven Christopher
(74) *Attorney, Agent, or Firm* — Slater Matsil, LLP

(57) ABSTRACT

A system for and a method of bonding a first wafer to a second wafer are provided. A second wafer chuck has a second surface, a profile of the second surface being adjustable by a profile control layer. The first wafer is placed on a first surface of a first wafer chuck, and the second wafer is placed on the second surface of the second wafer chuck. The first wafer and the second wafer are warped prior to bonding to form a first warped wafer and a second warped wafer, respectively. The first warped wafer is bonded to the second warped wafer.

20 Claims, 10 Drawing Sheets

(56) References Cited

U.S. PATENT DOCUMENTS

| | | | |
|---|---|---|---|
| 7,435,311 B1 * | 10/2008 | Marzen | B32B 37/003 |
| | | | 156/285 |
| 7,479,441 B2 | 1/2009 | Kirk et al. | |
| 7,980,287 B2 | 7/2011 | Hwang | |
| 8,307,543 B2 | 11/2012 | Lee | |
| 8,575,002 B2 * | 11/2013 | Broekaart | H01L 21/187 |
| | | | 257/E21.211 |
| 9,040,334 B2 | 5/2015 | Chu et al. | |
| 2005/0018122 A1 | 1/2005 | Hong | |
| 2006/0292822 A1 | 12/2006 | Xie | |
| 2010/0139836 A1 | 6/2010 | Horikoshi | |
| 2010/0248446 A1 * | 9/2010 | Liu | H01L 21/304 |
| | | | 438/459 |
| 2012/0006463 A1 | 1/2012 | Gaudin | |
| 2012/0024456 A1 * | 2/2012 | Lin | H01L 21/67092 |
| | | | 156/64 |
| 2012/0186741 A1 | 7/2012 | Lake | |
| 2013/0256824 A1 | 10/2013 | Mizuta et al. | |
| 2014/0261960 A1 | 9/2014 | Lin et al. | |
| 2015/0210057 A1 | 7/2015 | Wagenleithner et al. | |

FOREIGN PATENT DOCUMENTS

| | | |
|---|---|---|
| TW | 200508017 A | 3/2005 |
| TW | 1244433 B | 12/2005 |
| TW | 200913815 A | 3/2009 |
| TW | 201225194 A | 6/2012 |
| TW | 201324629 A | 6/2013 |
| TW | 201436068 A | 9/2014 |
| WO | 2014191033 A1 | 12/2014 |

\* cited by examiner

APPARATUS AND METHOD FOR WAFER LEVEL BONDING

BACKGROUND

Semiconductor manufacturers face a constant challenge to comply with Moore's Law. They constantly strive to continually decrease feature sizes, such as sizes of active and passive devices, interconnecting wire widths and thicknesses, and power consumption as well as increase device density, wire density and operating frequencies. These smaller electronic components also require smaller packages that utilize less area than packages of the past, in some applications.

Three dimensional integrated circuits (3DICs) are a recent development in semiconductor packaging in which multiple semiconductor dies are stacked upon one another, such as package-on-package (PoP) and system-in-package (SiP) packaging techniques. Some methods of forming 3DICs involve bonding together two or more semiconductor wafers, and active circuits such as logic, memory, processor circuits and the like located on different semiconductor wafers. The commonly used bonding techniques include direct bonding, chemically activated bonding, plasma activated bonding, anodic bonding, eutectic bonding, glass frit bonding, adhesive bonding, thermo-compressive bonding, reactive bonding and/or the like. Once two semiconductor wafers are bonded together, the interface between two semiconductor wafers may provide an electrically conductive path between the stacked semiconductor wafers.

One advantageous feature of stacked semiconductor devices is that much higher density can be achieved by employing stacked semiconductor devices. Furthermore, stacked semiconductor devices can achieve smaller form factors, cost-effectiveness, increased performance and lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
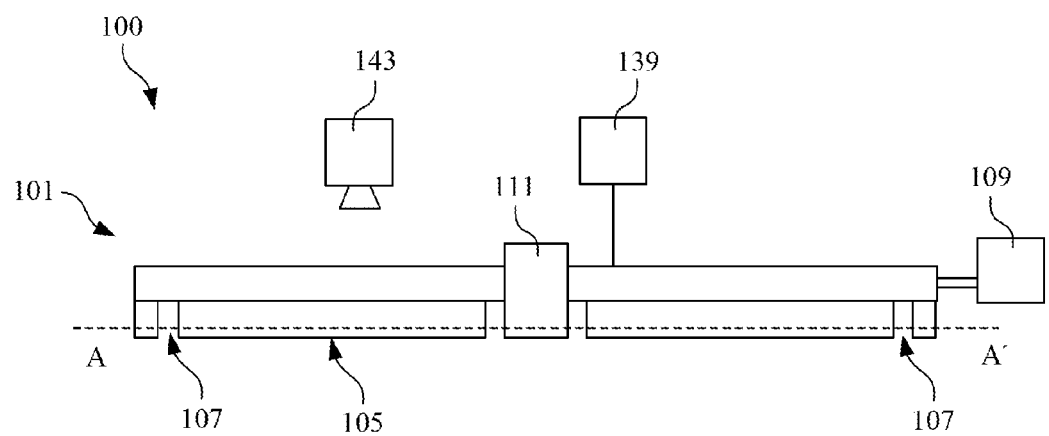
FIG. 1A is a cross-sectional view illustrating a wafer bonding system in accordance with some embodiments.
Figure 1A:
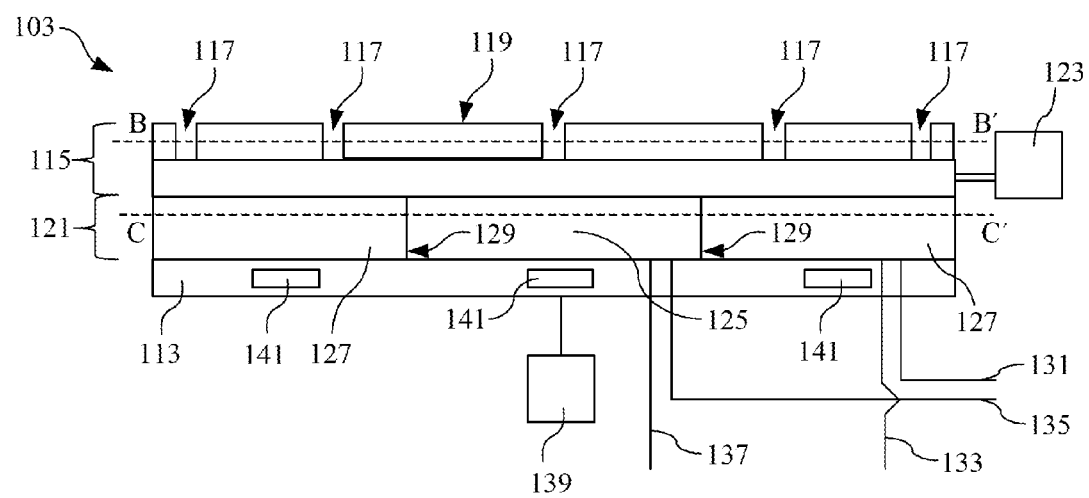

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
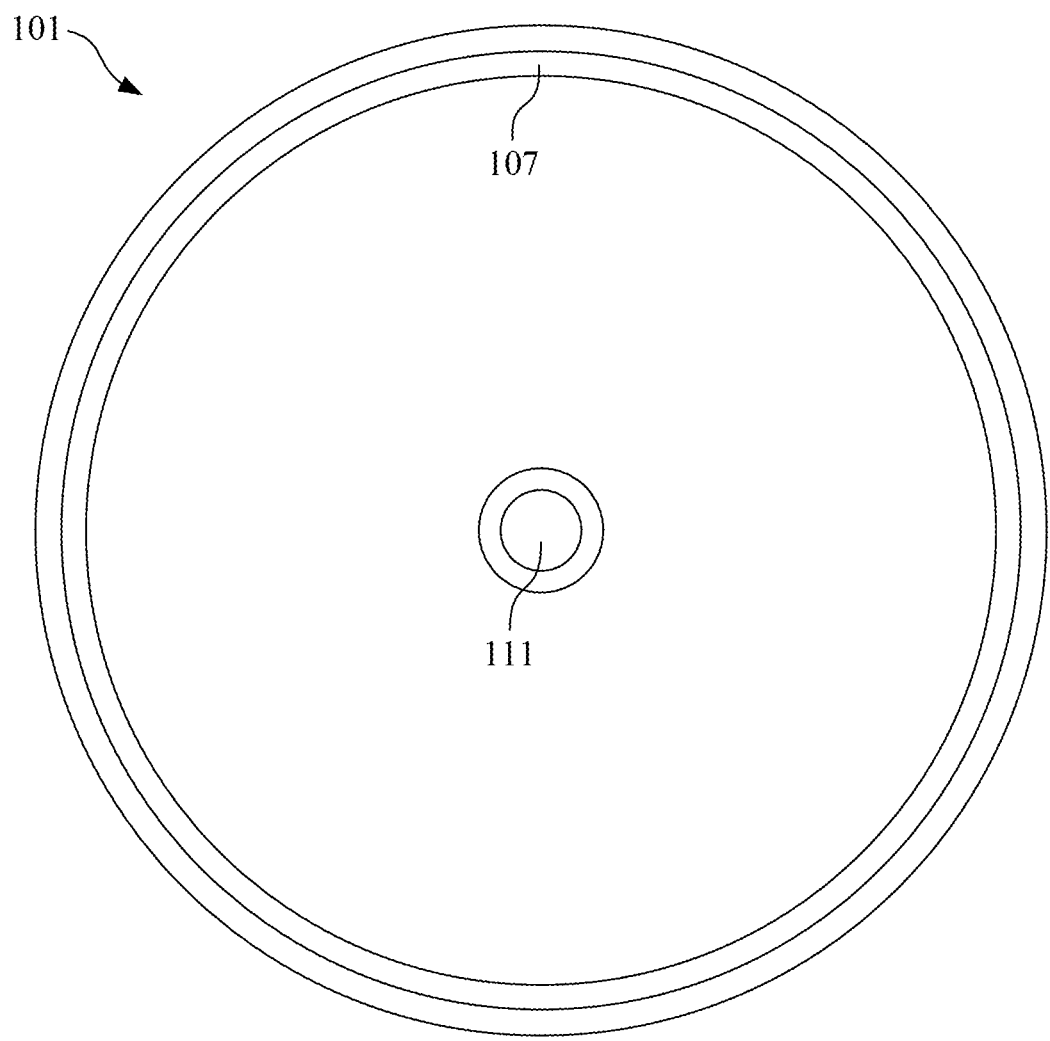
FIGS. 1B-1D are planar views illustrating a wafer bonding system in accordance with some embodiments.
Figure 1C:
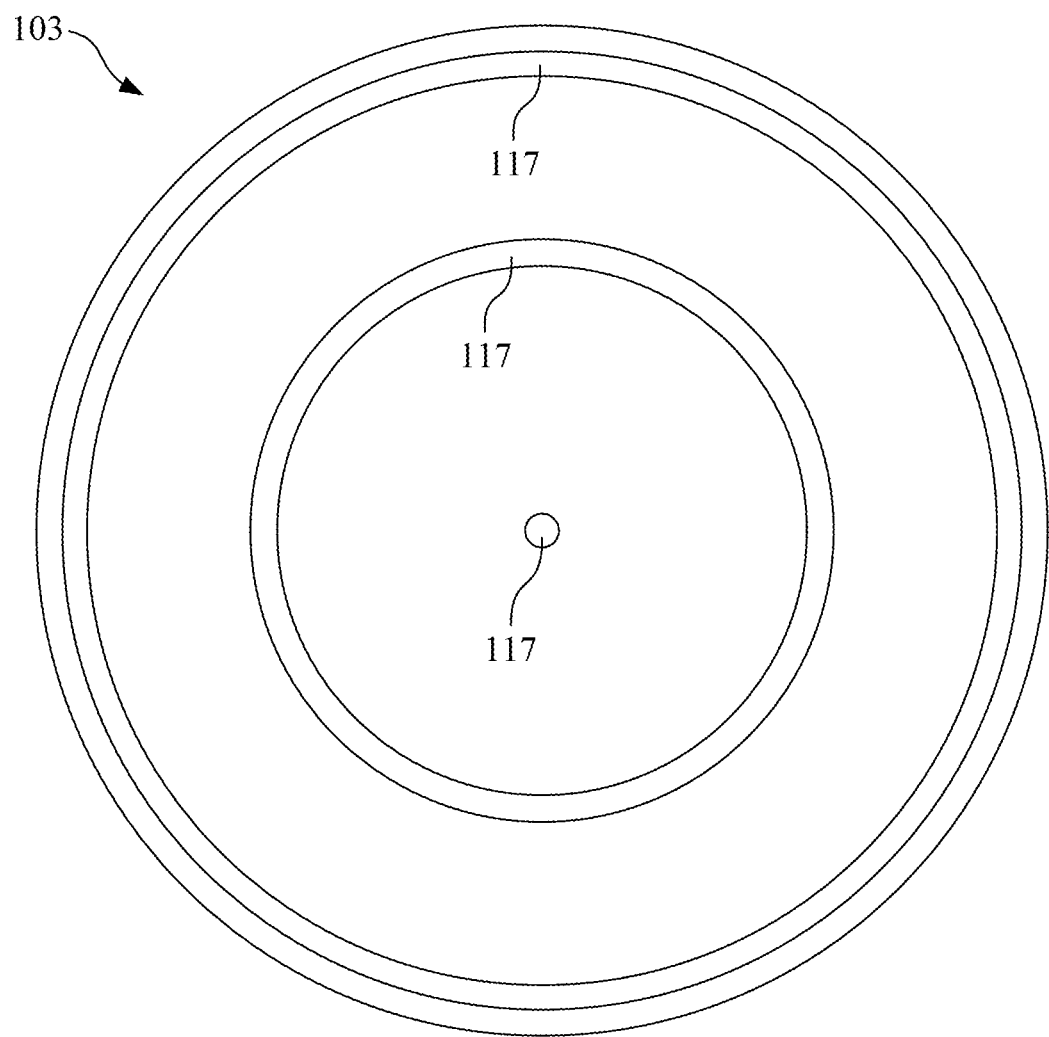
Figure 1D:
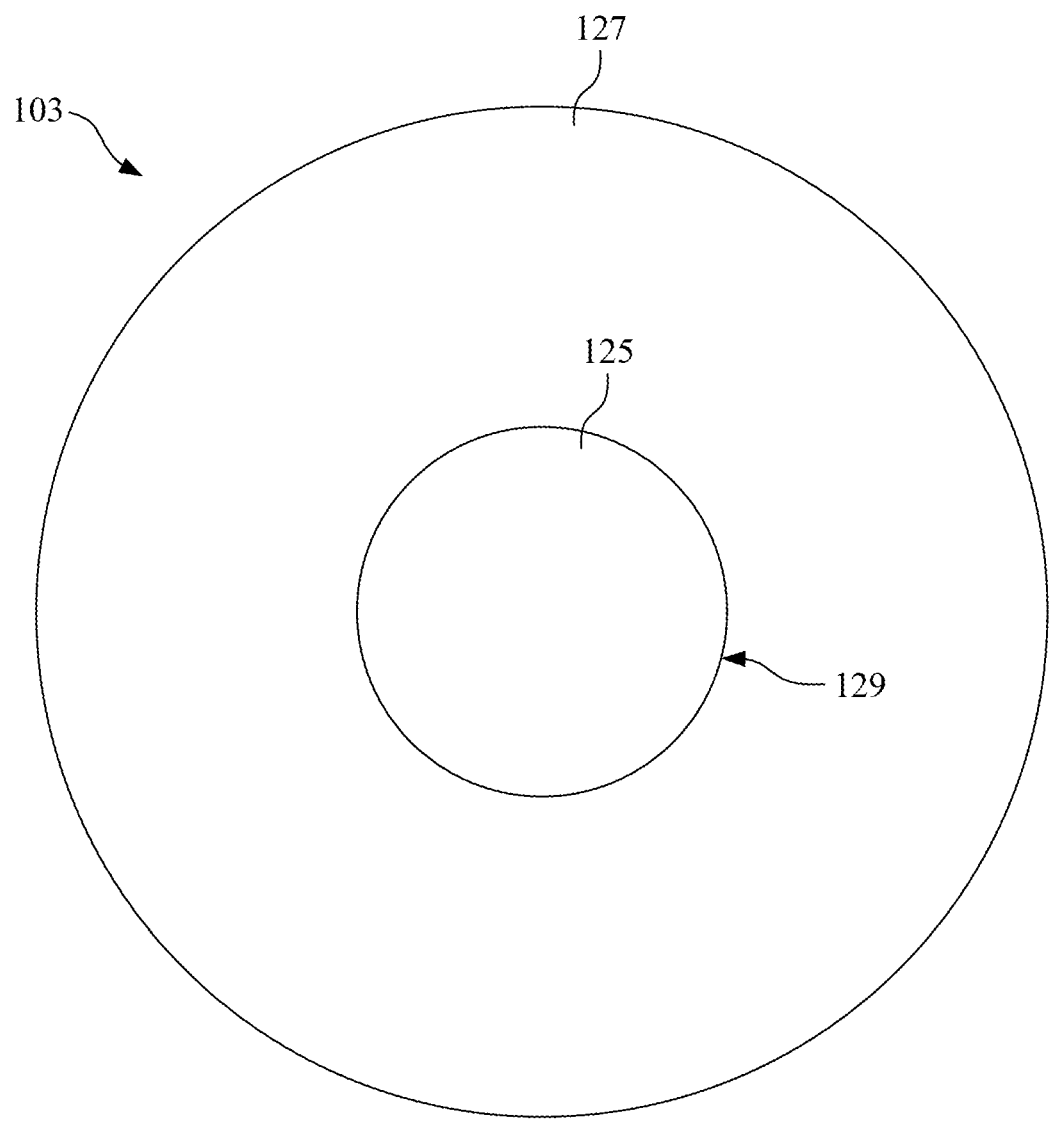

FIG. 1A illustrates a cross-sectional view and FIGS. 1B-1D illustrate planar views (through lines AA', BB' and CC' of FIG. 1A, respectively), of a wafer bonding system 100 with a first wafer chuck 101 and a second wafer chuck 103 that can be positioned to face each other. As described below in greater detail, in some embodiments, the first wafer chuck 101 and the second wafer chuck 103 are used to bond a first semiconductor wafer 301 (not illustrated in FIGS. 1A-1D but illustrated and discussed below with respect to FIG. 3) to a second semiconductor wafer 303 (also not illustrated in FIGS. 1A-1D but illustrated and discussed below with respect to FIG. 3).

Referring first to FIG. 1A, the first wafer chuck 101 comprises any suitable material that may be processed to have first openings 107 along a first surface 105. In some embodiments, for example, silicon based materials, such as glass, silicon oxide, silicon nitride, or other materials, such as aluminum oxide, combinations of any of these materials, or the like may be used. Additionally, the first wafer chuck 101 may have a diameter that is suitable to hold the first semiconductor wafer 301 (see FIG. 3), and the diameter of the first wafer chuck 101 may vary according to a diameter of the first semiconductor wafer 301.

In some embodiments, the first openings 107 are connected to a first vacuum pump 109. During operation the first vacuum pump 109 evacuates any gases from the first openings 107, thereby lowering the pressure within the first openings 107 relative to the ambient pressure. When the first semiconductor wafer 301 is placed against the first surface 105 and the pressure within the first openings 107 has been reduced by the first vacuum pump 109, the pressure difference between the side of the first semiconductor wafer 301 facing the first openings 107 and the side of the first semiconductor wafer 301 facing away from the first openings 107 will hold the first semiconductor wafer 301 against the first surface 105. In the illustrated embodiment, the first wafer chuck 101 has a pin 111 that extends through the first wafer chuck 101 in order to warp the first semiconductor wafer 301 after the first semiconductor wafer 301 has been attached to the first wafer chuck 101, as explained below in greater detail.

Referring further to FIG. 1A, the second wafer chuck 103 comprises a hard chuck 113, a vacuum distribution layer 115 having second openings 117 on a second surface 119, and a profile control layer 121 interposed between the hard chuck 113 and the vacuum distribution layer 115. In some embodiments, the hard chuck 113 may comprise of materials similar to those of the first wafer chuck 101, and the vacuum distribution layer 115 comprises materials having sufficient flexibility. As described below in greater detail, the profile control layer 121 controls a profile the second surface 119 of the vacuum distribution layer 115, which in turn controls a profile of the second semiconductor wafer 303 (see FIG. 3) attached to the second surface 119 of the vacuum distribution layer 115. Accordingly, the profile of the second semiconductor wafer 303 conforms to the profile of the vacuum distribution layer 115. Additionally, the second wafer chuck 103 may have a diameter that is suitable to hold the second semiconductor wafer 303, and the diameter of the second wafer chuck 103 may vary according to a diameter of the second semiconductor wafer 303. In some embodiments, the diameter of the second wafer chuck 103 may be similar to the diameter of the first wafer chuck 101, although alternatively the diameter of the second wafer chuck 103 may be different from the diameter of the first wafer chuck 101. Similarly, the second openings 117 may be similar to the first openings 107, and may also be used to hold and warp the second semiconductor wafer 303 to the second wafer chuck 103.

In the illustrated embodiment, the second openings 117 are connected to a second vacuum pump 123. During operation the second vacuum pump 123 evacuates any gases from the second openings 117, thereby lowering the pressure within the second openings 117 relative to the ambient pressure. When the second semiconductor wafer 303 is placed against the second surface 119 and the pressure within the second openings 117 has been reduced by the second vacuum pump 123, the pressure difference between the side of the second semiconductor wafer 303 facing the second openings 117 and the side of the second semiconductor wafer 303 facing away from the second openings 117 will hold the second semiconductor wafer 303 against the second surface 119.

Referring further to FIGS. 1A and 1D, the profile control layer 121 is interposed between the hard chuck 113 and the vacuum distribution layer 115, and is utilized to control the profile of the second wafer chuck 103. In the illustrated embodiments, the profile control layer 121 comprises a first control zone 125, and a second control zone 127 separated from the first control zone 125 by a membrane 129. In some embodiments, the membrane may comprise any materials with suitable flexibility, such as, for example, plastic, polymer, metal, polymer-coated metal, or the like. Control zones, such as the first control zone 125 and the second control zone 127, as shown in FIGS. 1A and 1D, are for illustrative purposes only, and the profile control layer 121 may comprise any suitable number of control zones to provide sufficient control for the profile of the second surface 119 of the profile control layer 121.

The first control zone 125 and the second control zone 127 are connected using a first inlet 131 and a first outlet 133, and a second inlet 135 and a second outlet 137, respectively, to one or more pumps (not shown), or similar. In some embodiments, the first control zone 125 and the second control zone 127 are connected to the same pump, or alternatively the first control zone 125 and the second control zone 127 are connected to separate pumps. The one or more pumps are utilized to fill and/or extract a suitable material, such as liquid, gas, or the like, from the first control zone 125 and the second control zone 127. In some embodiments, liquids such as water, an organic fluid, or the like may be used to fill the first control zone 125 and the second control zone 127.

As described below in greater detail, the first control zone 125 and the second control zone 127 are filled with a suitable material in order to change a first volume of the first control zone 125 and a second volume of the second control zone 127. In some embodiments, changes in the first volume and the second volume cause warping of the vacuum distribution layer 115 and the second semiconductor wafer 303 attached to the vacuum distribution layer 115.

Referring further to FIG. 1A, a motor 139 may be coupled to each of the first wafer chuck 101 and the second wafer chuck 103 in accordance to some embodiments. In other embodiments, one motor 139 may be coupled to both or only one of the first wafer chuck 101 and the second wafer chuck 103. In some embodiments, the motor 139 may comprise a piezoelectric motor, a linear motor, or the like. Alternatively, the motor 139 may comprise other types of motors. The motor 139 is adapted to adjust an x position, a y position, a z position, and/or an angular position ($\theta$) of the first wafer chuck 101 relative to the second wafer chuck 103, and thus the first semiconductor wafer 301 relative to the second semiconductor wafer 303 in some embodiments. In addition, in some embodiments, the motor 139 is coupled to the pin 111, and may control a length of a portion of the pin 111 that extends through the first wafer chuck 101.

In some embodiments, the second wafer chuck 103 further comprises one or more thermal controllers 141 for thermally controlling the profile control layer 121 and thus the second semiconductor wafer 303. In the illustrated embodiment, the first control zone 125 and the second control zone 127 have the individual thermal controllers 141, which allow independent temperature control for the first control zone 125 and the second control zone 127, respectively. In other embodiments, the first wafer chuck 101 may also comprise thermal controllers (not shown), which independently control a temperature of the first wafer chuck 101 and thus the first semiconductor wafer 301. The one or more thermal controllers 141 are adapted to control a temperature of the second semiconductor wafer 303 to a temperature of about 1° C. to about 400° C., in some embodiments. Alternatively, the one or more thermal controllers 141 are adapted to control wafer temperature at other temperature ranges, in other embodiments. In other embodiments, thermal controllers for controlling temperatures of bonded wafers are not included for the wafer bonding system 100. The one or more thermal controllers 141 may be used to compensate a thermal expansion of the second semiconductor wafer 303.

The one or more thermal controllers 141 comprise thermal couplers or thermal plates in some embodiments. Alternatively, the one or more thermal controllers 141 may comprise other devices or instruments adapted to control the temperatures of the first semiconductor wafer 301 and/or the second semiconductor wafer 303. Including the one or more thermal controllers 141 and heating/cooling the first semiconductor wafer 301 and/or the second semiconductor wafer 303 during the bonding process decreases or eliminates run-out, e.g., the first semiconductor wafer 301 and the second semiconductor wafer 303 difference, wherein alignment can become worse from the center to the edge of bonded wafers, in some embodiments. The run-out or a scaling effect is caused by dissimilar deformations of the first semiconductor wafer 301 and the second semiconductor wafer 303, and is hard to eliminate using conventional alignment methods.

Additionally, in the illustrated embodiment, an alignment monitor 143 is connected to the motor 139 using, e.g., wiring (not individually illustrated in FIG. 1A). The alignment monitor 143 can emit infrared (IR) or visible electromagnetic energy towards and through, e.g., the first wafer chuck 101 in order to check the alignment of the first semiconductor wafer 301 relative to the second semiconductor wafer 303. This information may then be passed to the motor 139 in order to perform any corrections that may be desired prior to initiating a bonding process of the first semiconductor wafer 301 and the second semiconductor wafer 303.

Figure 2:
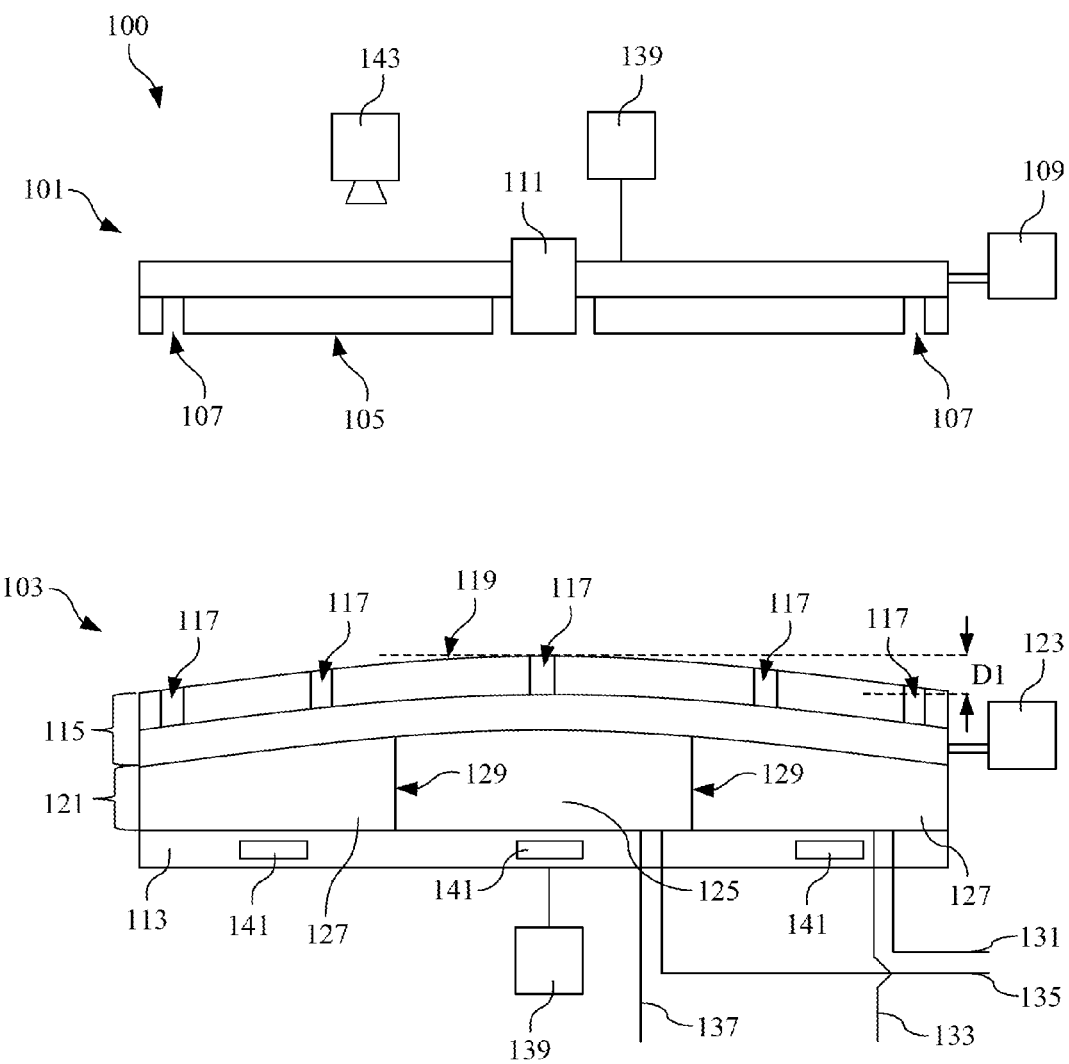
FIGS. 2-6 are cross-sectional views illustrating a method for bonding semiconductor wafers in accordance with some embodiments.

FIG. 2-7 illustrate cross-sectional views describing various steps of a wafer bonding process of the first semiconductor wafer 301 and the second semiconductor wafer 303 in accordance with some embodiments. FIG. 2 illustrates preparation of the second wafer chuck 103 prior placing the second semiconductor wafer 303 on the second wafer chuck 103. In the illustrated embodiment, the first volume of the first control zone 125 and the second volume of the second control zone 127 are changed by filling the first control zone 125 and the second control zone 127 by a suitable material using the pump. The volumes of the first control zone 125 and the second control zone 127 can be changed since the membrane 129 comprises a flexible material as described above with reference to FIG. 1A.

Referring further to FIG. 2, the vacuum distribution layer 115 is warped by the profile control layer 121. In the illustrated embodiment, the second surface 119 of the vacuum distribution layer 115 has a convex shape with a center of the second surface 119 of the vacuum distribution layer 115 being higher than edges of the second surface 119 of the vacuum distribution layer 115. A curvature of the second surface 119 of the vacuum distribution layer 115 may vary according to design specifications of the second semiconductor wafer 303 (see FIG. 3). In some embodiments, a first distance D1 between the center of the second surface 119 of the vacuum distribution layer 115 and a plane comprising the edges of the second surface 119 of the vacuum distribution layer 115 may be between about 0 μm and about 300 μm.

In other embodiments, the second surface 119 of the vacuum distribution layer 115 may have a concave shape with the center of the second surface 119 of the vacuum distribution layer 115 being lower than the edges of the second surface 119 of the vacuum distribution layer 115. In some embodiments, a first distance D1 between the center of the second surface 119 of the vacuum distribution layer 115 and a plane comprising the edges of the second surface 119 of the vacuum distribution layer 115 may be between about 0 μm and about 300 μm.

In some embodiments, the wafer bonding process is a batch process, wherein a first batch of wafers (similar to the first semiconductor wafer 301) is bonded to a second batch of wafers (similar to the second semiconductor wafer 303). Accordingly, the first control zone 125 and the second control zone 127 are filled by a suitable material once prior to placing wafers on the second wafer chuck 103 and the profile of the second surface 119 of the vacuum distribution layer 115 remains unchanged until the first batch of wafers is bonded to the second batch of wafers. Subsequently, the profile of the second surface 119 of the vacuum distribution layer 115 may be changed by adjusting the first control zone 125 and the second control zone 127 according to the design specifications of bonded wafers in the next batch.

In alternative embodiments, the profile of the second surface 119 of the vacuum distribution layer 115 is set by filling, for example, only the first control zone 125. Alternatively, the profile of the second surface 119 of the vacuum distribution layer 115 is set by filling, for example, only the second control zone 127. Any suitable combination of control zones of the profile control layer 121 may be filled to change the shape of the second surface 119 of the vacuum distribution layer, and all such combinations are fully intended to be included within the scope of the embodiments.

In other embodiments, the vacuum distribution layer 115 of the second wafer chuck 103 is warped only after the second semiconductor wafer 303 is placed onto the second wafer chuck 103, with the second surface 119 having a planar profile. After placing the second semiconductor wafer 303 onto the second wafer chuck 103 (for example, as described below with reference to FIG. 3), the first control zone 125 and the second control zone 127 of the profile control layer 121 are filled by a suitable material to warp the second surface 119 of the vacuum distribution layer 115. Subsequently, the second surface 119 of the vacuum distribution layer 115 may be re-adjusted every time a new wafer is placed onto the second wafer chuck 103.

Figure 3:
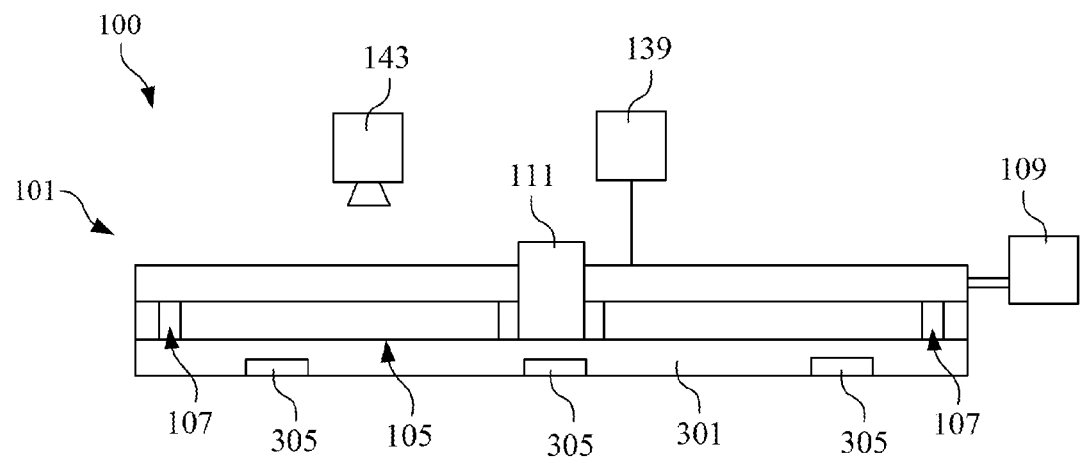
Figure 3:
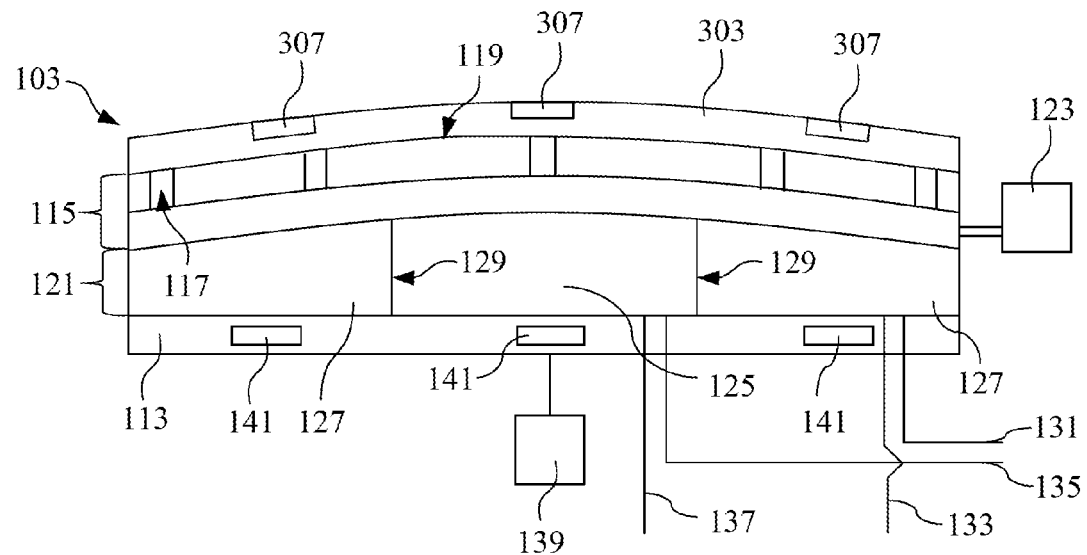

FIG. 3 illustrates a placement of the first semiconductor wafer 301 and the second semiconductor wafer 303 onto the first wafer chuck 101 and the second wafer chuck 103, respectively. The first semiconductor wafer 301 may comprise a semiconductor substrate (not shown), e.g., bulk silicon, doped or undoped, or a layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

Additionally, the first semiconductor wafer 301 may also comprise dielectric and metallization layers (not individually shown) over the semiconductor substrate in order to form a plurality of dies on the first semiconductor wafer 301. These dies may be any suitable type of die, such as, for example, an ASIC device, an imaging sensor, a logic die, a memory device, or the like. However, any other suitable type of devices, such as system on a chip type of devices, may alternatively be utilized.

The second semiconductor wafer 303 may be similar to the first semiconductor wafer 301, such as by comprising, e.g., a semiconductor substrate such as bulk silicon, a layer of an SOI substrate, or the like. Alternatively, the second semiconductor wafer 303 may be an insulative layer on a semiconductor layer that will be bonded to the first semiconductor wafer 301 in order to form an SOI substrate. Any suitable combination of materials that are desired to be bonded together may alternatively be utilized, and all such combinations are fully intended to be included within the scope of the embodiments.

Additionally, the second semiconductor wafer 303 may also comprise dielectric and metallization layers (not individually shown) over the semiconductor substrate in order to form a plurality of dies on the second semiconductor wafer 303. These dies may be any suitable type of die, such as, for example, an ASIC device, an imaging sensor, a logic die, a memory device, or the like. However, any other suitable type of devices, such as system on a chip type of devices, may alternatively be utilized.

For example, the first semiconductor wafer 301 may comprise a wafer with a plurality of ASIC dies, and the second semiconductor wafer 303 may comprise a wafer with system on a chip (SOC) devices on it that are desired to be bonded to the ASIC dies on the first semiconductor wafer 301.

In some embodiments, the first semiconductor wafer 301 further has first alignment marks 305 and the second semiconductor wafer 303 has second alignment marks 307. The first alignment marks 305 and the second alignment marks 307 may be formed in the first semiconductor wafer 301 and the second semiconductor wafer 303 using, for example, a patterning process. The first alignment marks 305 and the second alignment marks 307 will be used to assist in the positioning of the first semiconductor wafer 301 relative to the second semiconductor wafer 303 during subsequent wafer bonding process steps.

Optionally, before placing the first semiconductor wafer 301 on the first wafer chuck 101 and placing the second semiconductor wafer 303 on the second wafer chuck 103, in some embodiments, the first semiconductor wafer 301 and/or the second semiconductor wafer 303 are exposed to a plasma process. The plasma process activates the wafer surface and facilitates the bonding process. In some embodiments, the first semiconductor wafer 301 and/or the second semiconductor wafer 303 are cleaned after the plasma process. The cleaning process may comprise using cleaning arms, mega-sonic transducer, a rinse system, a drain system, and a spin module to keep the wafer surface clean and activated, as examples. A cleaning solvent including deionized (DI) water, acid, and/or base can be used to remove/protect the bonding surface, for example. Alternatively, other cleaning solvents and processes may be used. The plasma process and/or the cleaning process are not included in the bonding process flow in some embodiments.

Referring further to FIG. 3, in the illustrated embodiment, the first semiconductor wafer 301 is placed onto the first wafer chuck 101 in a planar condition. Once the first semiconductor wafer 301 is in place on the first wafer chuck 101, the first vacuum pump 109 is initiated, lowering the pressure within the first openings 107 relative to the ambient pressure, and holding the first semiconductor wafer 301 to the first wafer chuck 101. In some embodiments, the first semiconductor wafer 301 may be intrinsically warped and the shape of the first semiconductor wafer 301 may change when the first vacuum pump 109 is initiated and may conform to the shape of the first surface 105.

FIG. 3 further illustrates a placement of the second semiconductor wafer 303 against the second wafer chuck 103. Similar to the placement of the first semiconductor wafer 301, the second semiconductor wafer 303 may be placed adjacent to the second wafer chuck 103 and the second vacuum pump 123 is initiated to lower the pressure within the second openings 117 relative to the ambient pressure. With the pressure lowered within the second openings 117, the second semiconductor wafer 303 will be warped into the same profile as the second surface 119 of the vacuum distribution layer 115. Also, if desired, a small force may be applied to the second semiconductor wafer 303 in order to position each part of the second semiconductor wafer against the second openings 117. In some embodiments, the second semiconductor wafer 303 may be intrinsically warped and the profile of the first semiconductor wafer 301 may change when the second vacuum pump 123 is initiated and may conform to the profile of the second surface 119 of the vacuum distribution layer 115.

The alignment monitor 143 and the motor 139 are electrically connected together by wiring (not individually illustrated in FIG. 3). In an embodiment, the alignment monitor 143 is activated to emit the IR or visible electromagnetic energy towards and through the first wafer chuck 101, the first semiconductor wafer 301, and the first alignment marks 305 on the first semiconductor wafer 301 to the second alignment marks 307 on the second semiconductor wafer 303. The motor 139 receives the information regarding the location of the second semiconductor wafer 303 from the alignment monitor 143 and adjusts the position of the second semiconductor wafer 303 relative to the position of the first semiconductor wafer 301 to perform an initial alignment of the first semiconductor wafer 301 and the second semiconductor wafer 303.

In some embodiments, a fine alignment may be performed using the alignment monitor 143, which continues to emit IR or visible electromagnetic energy, and the motor 139. Such a fine alignment may be utilized to ensure that the first alignment marks 305 and the second alignment marks 307 are aligned with each other after the coarse alignment described above.

Figure 4:
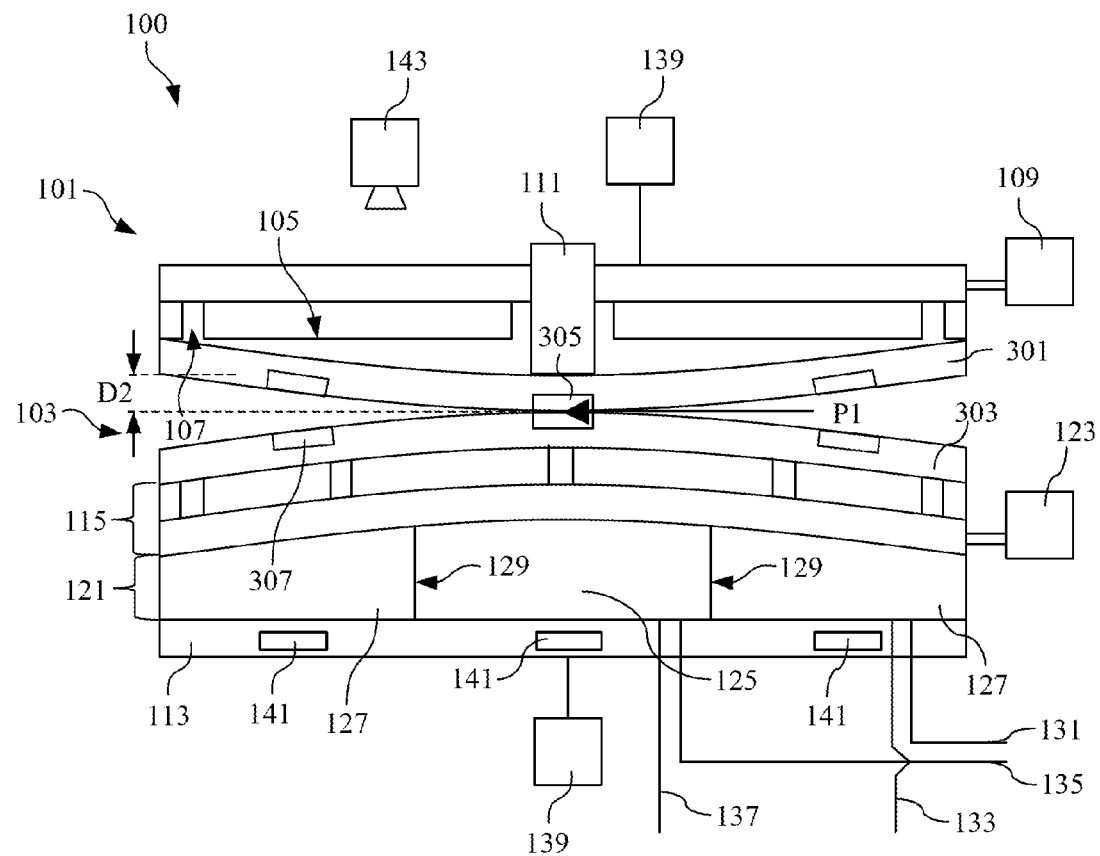

FIG. 4 illustrates an initiating of a bonding process to bond the first semiconductor wafer 301 to the second semiconductor wafer 303. In the illustrated embodiment the first wafer chuck 101 and the second wafer chuck 103 are moved (e.g., by the motor 139) relative to each other such that the first alignment marks 305 and the second alignment marks 307 are aligned with each other. Once aligned, the pin 111 is extended by the motor 139, contacts the side of the first semiconductor wafer 301 that is attached to the first surface 105 of the first wafer chuck 101 and warps the first semiconductor wafer 301. In some embodiments, the first semiconductor wafer 301 is warped to a concave shape with a center of the first semiconductor wafer 301 being lower than edges of the first semiconductor wafer 301. A curvature of the first semiconductor wafer 301 may vary according to design specifications of bonded wafers. In some embodiments, a second distance D2 between the center of the first semiconductor wafer 301 and a plane comprising the edges of the first semiconductor wafer 301 may be between about 10 μm and about 200 μm.

Referring further to FIG. 4, the first semiconductor wafer 301 (which has been pre-warped) and the second semiconductor wafer 303 (which has also been pre-warped) are brought into contact at a first point P1. Once in contact, the first semiconductor wafer 301 and the second semiconductor wafer 303 will begin to bond at the first point P1. In some embodiments, the first wafer chuck 101 and the second wafer chuck 103 are used to apply pressure between the first semiconductor wafer 301 and the second semiconductor wafer 303. In an embodiment, a pressure generating force may be between about 5 mN and about 1000 mN. Additionally, if desired, heat may be applied using the thermal controllers 141 to facilitate the wafer bonding process.

Figure 5:
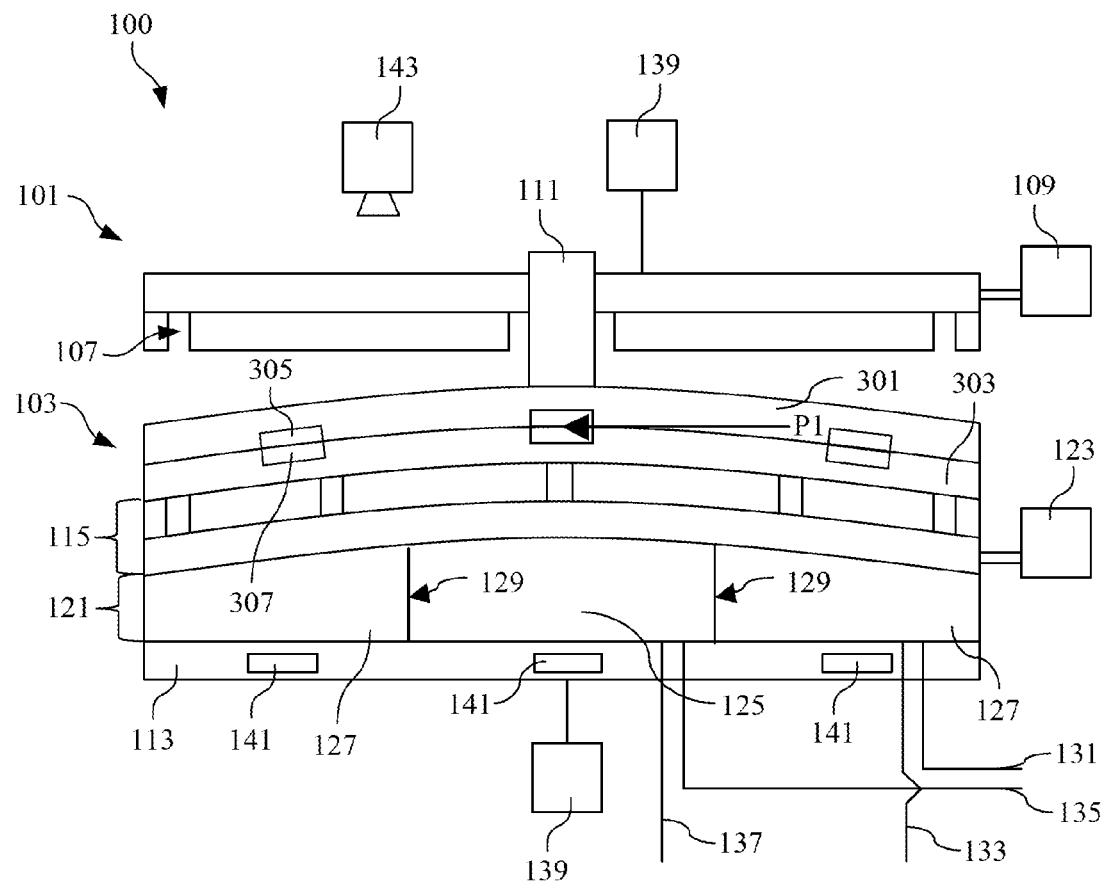

FIG. 5 illustrates bonding of the first semiconductor wafer 301 to the second semiconductor wafer. As the pressure is applied to the first semiconductor wafer 301 and the second semiconductor wafer 303, the first vacuum pump 109 is turned off and the vacuum is removed from the first semiconductor wafer 301. The first semiconductor wafer 301 and the second semiconductor wafer 303 will bond together at each point where the first semiconductor wafer 301 comes into contact with the second semiconductor wafer 303. As both the first semiconductor wafer 301 and the second semiconductor wafer 303 are pre-warped in the outward direction with respect to the first surface 105 and the second surface 119, respectively, this pressure will cause the bonding to proceed in a wave from the first point P1 and moving outwards towards the edges of the first semiconductor wafer 301 and the second semiconductor wafer 303.

Figure 6:
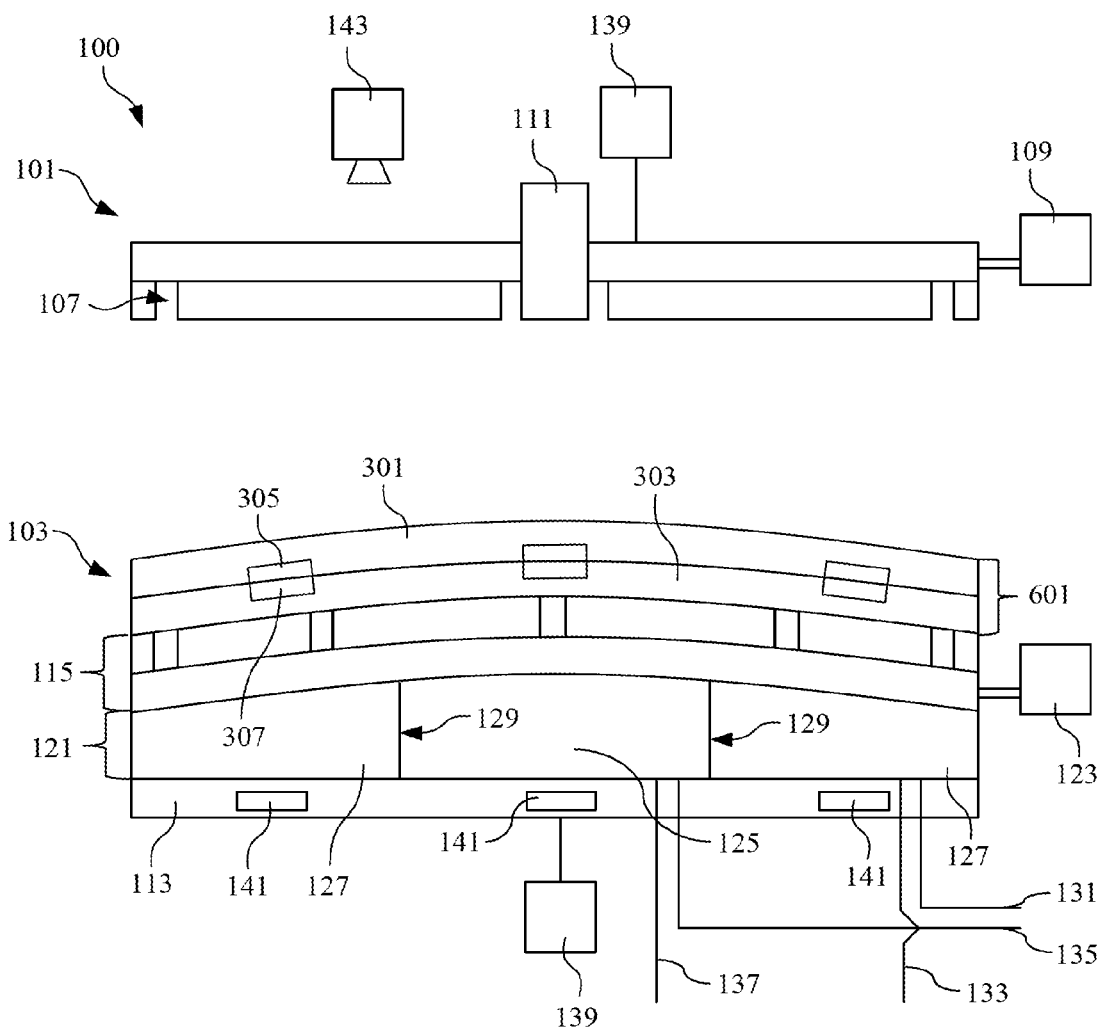

FIG. 6 illustrates a separation of the first wafer chuck 101 from the bonded wafers 601, which comprise the first semiconductor wafer 301 bonded to the second semiconductor wafer 303. In the illustrated embodiment, the first wafer chuck 101, in which the vacuum has been removed, is moved by the motor 139 away from the bonded wafers 601, leaving the bonded wafers 601 on the second wafer chuck 103.

Subsequently, the bonded wafers 601 are removed from the second wafer chuck 103. In an embodiment in which the second openings 117 are utilized to hold the second semiconductor wafer 303 to the second wafer chuck 103, the second vacuum pump 123 may be turned off and an atmospheric pressure may be allowed to enter the second openings 117. Once the pressure in the second openings 117 is equalized with the ambient pressure, the bonded wafers 601 may be removed from the second wafer chuck 103.

After the bonded wafers 601 are unloaded from the wafer bonding system 100, an infrared (IR) measurement (not shown) can be performed to check the alignment of the bonding for overlay control. In some embodiments, an IR energy is directed through the bonded wafers 601 to the first alignment marks 305 and the second alignment marks 307 and the misalignment of the first alignment marks 305 relative to the second alignment marks 307 may be measured. In some embodiments, results of the IR measurement may be used as a feedback to the pumps that control the profile control layer 121 and adjust the profile of the vacuum distribution layer 115 to reduce the misalignment between the first alignment marks 305 and the second alignment marks 307. In some embodiments, an overlay control system described above is a module of the wafer bonding system 100. In other embodiments, the overlay control system is separate from the wafer bonding system 100.

In the embodiments described above, the first wafer chuck 101 is different from the second wafer chuck 103, and only the second wafer chuck 103 comprises the profile control layer 121. However, in other embodiments, both chucks may comprise a profile control layer, which allows precise control of shapes of bonded wafers. Moreover, as described above in greater detail, the first semiconductor wafer 301 and the second semiconductor wafer 303 are held by the first wafer chuck 101 and the second wafer chuck 103, respectively, using openings that are controlled by vacuum pumps. In other embodiments, the first semiconductor wafer 301 and the second semiconductor wafer 303 may be held by, for example, mechanical clamping, electrostatic force, physical adhesion, or the like.

Figure 7:
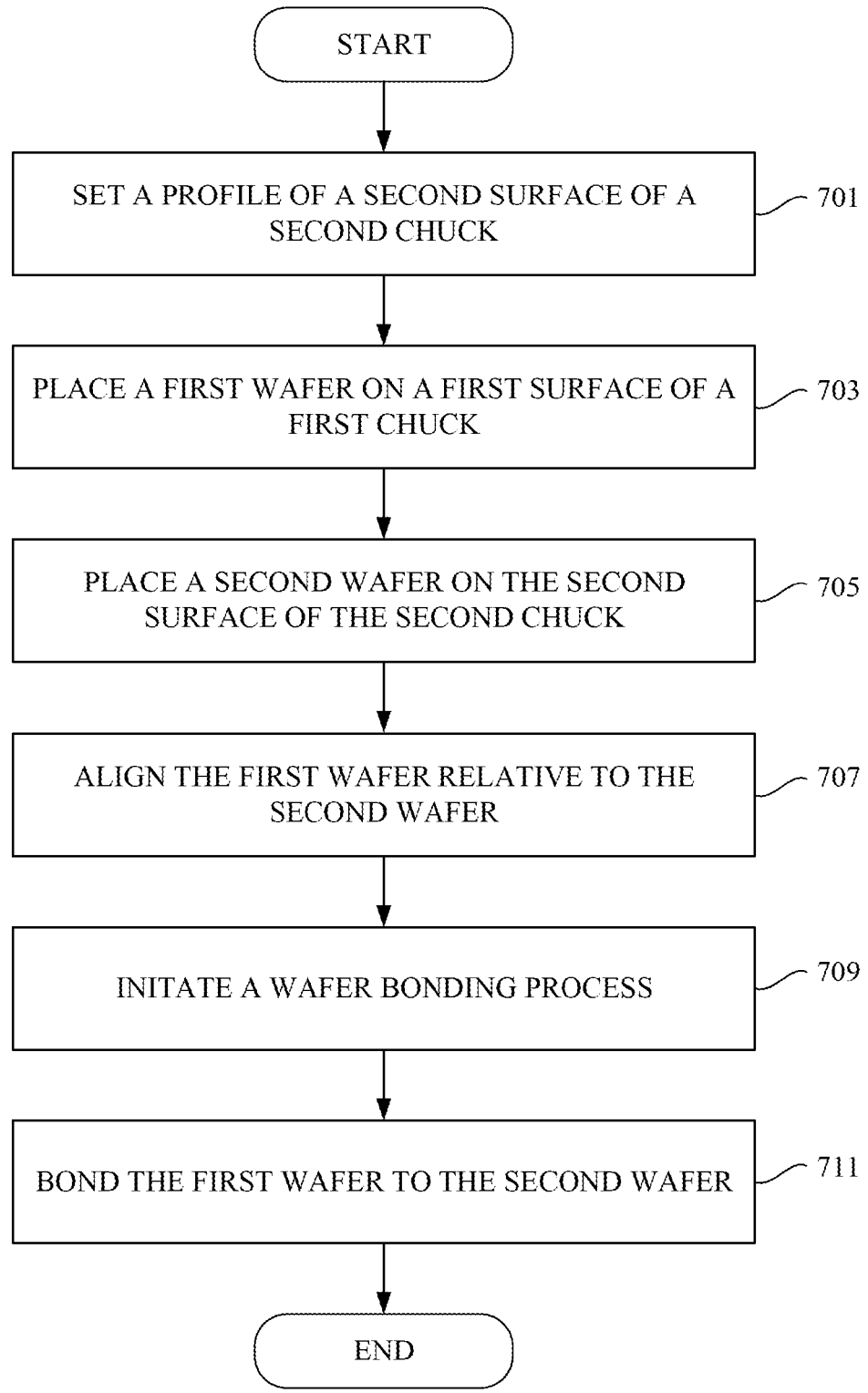
FIG. 7 is a flowchart illustrating a method for bonding semiconductor wafers in accordance with some embodiments.

FIG. 7 is a flowchart illustrating a method for bonding semiconductor wafers in accordance with some embodiments. In step 701, a profile of a second surface of a second chuck is set by using a profile control layer of the second chuck as described above with reference to FIG. 2. In step 703 a first wafer is placed on a first surface of a first chuck and held by first vacuum openings connected to a first vacuum pump as described above with reference to FIG. 3. In step 705 a second wafer is placed on the second surface of the second chuck and held by second vacuum openings connected to a second vacuum pump as described above with reference to FIG. 3. In step 707, the first wafer is aligned relative to the second wafer using alignment marks and an alignment monitor as described above with reference to FIG. 3. In step 709, a pin of the first chuck is extended to warp the first wafer and to initiate a wafer bonding process as described above with reference to FIG. 4. In step 711, the first vacuum pump of the first chuck is turned off and the first wafer is bonded to the second wafer as described above with reference to FIG. 5.

Precise control of profiles of the wafers prior to bonding allows to minimize the misalignment of wafers caused by the natural warpage of the first semiconductor wafer 301 and the second semiconductor wafer 303 (also known as runout) in some embodiments.

In an embodiment, a wafer bonding system comprises a first wafer chuck having a first surface, and a second wafer chuck having a second surface. The second wafer chuck comprises a profile control layer, the profile control layer having a first control zone with a first adjustable volume, wherein a profile of the second surface is adjustable by the profile control layer.

In another embodiment, a wafer bonding system comprises a first wafer chuck and a second wafer chuck. The second wafer chuck comprises a profile control layer, wherein a profile of the second wafer chuck is adjustable by the profile control layer, and a plurality of control zones in profile control layer, wherein a first control zone of the plurality of control zones has a flexible sidewall.

In yet another embodiment, a method of bonding wafers, the method comprises providing a first wafer chuck, providing a second wafer chuck, the second wafer chuck comprising a profile control layer, the profile control layer having one or more control zones, and adjusting a first volume of a first control zone of the profile control layer, thereby setting a profile of a surface of the second wafer chuck. The method further comprises placing a first wafer onto the first wafer chuck, placing a second wafer onto the second wafer chuck, and bonding the first wafer to the second wafer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A wafer bonding system comprising:
   a first wafer chuck having a first surface; and
   a second wafer chuck having a second surface, the second wafer chuck comprising:
   a profile control layer, the profile control layer having a first control zone with a first adjustable volume and a second control zone with a second adjustable volume, wherein a profile of the second surface is adjustable by the profile control layer, wherein the first adjustable volume and the second adjustable volume are isolated by a flexible sidewall, wherein the second adjustable volume encircles the first adjustable volume, and wherein the first adjustable volume is adjustable independently from the second adjustable volume; and
   a first holding mechanism over the profile control layer, the first holding mechanism being configured to hold a first wafer against the second surface of the second wafer chuck, wherein the first holding mechanism comprises first vacuum openings in the second surface.

2. The wafer bonding system of claim 1, further comprising a second holding mechanism configured to hold a second wafer against the first surface of the first wafer chuck.

3. The wafer bonding system of claim 2, wherein the second holding mechanism comprises second vacuum openings in the first surface.

4. The wafer bonding system of claim 1, wherein the first control zone and the second control zone are separated by a flexible membrane.

5. A wafer bonding system comprising:
a first wafer chuck; and
a second wafer chuck, the second wafer chuck comprising:
  a profile control layer, wherein a profile of the second wafer chuck is adjustable by the profile control layer; and
  a plurality of control zones in the profile control layer, wherein a first control zone of the plurality of control zones is separated from a second control zone of the plurality of control zones by a flexible sidewall, wherein the first control zone and the second control zone share the flexible sidewall, and wherein the second control zone encircles the first control zone.

6. The wafer bonding system of claim 5, wherein the first control zone has a first thermal controller and the second control zone has a second thermal controller.

7. The wafer bonding system of claim 6, wherein the first thermal controller provides temperature control independent to the second thermal controller.

8. The wafer bonding system of claim 5, wherein the first control zone has a first volume and the second control zone has a second volume, the first volume being adjustable independently from the second volume.

9. The wafer bonding system of claim 5, wherein the first wafer chuck comprises a pin, the pin being configured to extend thereby warping a wafer placed onto the first wafer chuck.

10. The wafer bonding system of claim 5, wherein a volume of the first control zone is adjusted by a gas pumped into the first control zone.

11. The wafer bonding system of claim 10, wherein a volume of the first control zone is adjusted by a liquid pumped into the first control zone.

12. A method of bonding wafers, the method comprising:
providing a first wafer chuck;
providing a second wafer chuck, the second wafer chuck comprising a profile control layer, the profile control layer having one or more control zones;
adjusting a first volume of a first control zone of the profile control layer and a second volume of a second control zone of the profile control layer, thereby setting a profile of a surface of the second wafer chuck, the first volume of the first control zone being adjusted independently from the second volume of the second control zone, the first volume being separated from the second volume by a flexible sidewall, wherein the second adjustable volume encircles the first adjustable volume;
placing a first wafer onto the first wafer chuck;
placing a second wafer onto the second wafer chuck, the second wafer being held at the surface of the second wafer chuck using a vacuum distribution layer of the second wafer chuck;
and bonding the first wafer to the second wafer.

13. The method of claim 12, wherein the adjusting the first volume of the first control zone comprises filling the first control zone with a gas by a pump.

14. The method of claim 12, wherein the adjusting the first volume of the first control zone comprises filling the first control zone with a liquid by a pump.

15. The method of claim 12, wherein the first wafer chuck comprises a pin, the pin being used to warp the first wafer prior to the bonding the first wafer to the second wafer.

16. The method of claim 12, further comprising warping the first wafer and warping the second wafer prior to bonding the first wafer to the second wafer.

17. The wafer bonding system of claim 1, wherein the first control zone is surrounded by the second control zone.

18. The wafer bonding system of claim 1, wherein the first control zone has a circular shape in a plan view, and wherein the second control zone has a ring shape in the plan view.

19. The wafer bonding system of claim 1, wherein at least one vacuum opening of the first vacuum openings has a ring shape in the plan view.

20. The wafer bonding system of claim 1, wherein the second wafer chuck further comprises one or more thermal controllers configured to control a temperature of the first wafer.

* * * * *